(12) United States Patent
Cho et al.

(10) Patent No.: US 10,832,986 B2
(45) Date of Patent: Nov. 10, 2020

(54) FAN-OUT SEMICONDUCTOR PACKAGE

(71) Applicant: SAMSUNG ELECTRONICS CO., LTD., Suwon-si (KR)

(72) Inventors: Jung Hyun Cho, Suwon-Si (KR); Young Sik Hur, Suwon-Si (KR); Yong Ho Baek, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/000,094

(22) Filed: Jun. 5, 2018

(65) Prior Publication Data
US 2019/0164863 A1 May 30, 2019

(30) Foreign Application Priority Data

Nov. 29, 2017 (KR) ........................ 10-2017-0162144

(51) Int. Cl.
*H01L 23/31* (2006.01)
*H01L 23/00* (2006.01)
(Continued)

(52) U.S. Cl.
CPC ........ *H01L 23/3185* (2013.01); *H01L 21/568* (2013.01); *H01L 23/13* (2013.01); *H01L 23/3128* (2013.01); *H01L 23/3135* (2013.01); *H01L 23/5384* (2013.01); *H01L 23/5385* (2013.01); *H01L 23/5389* (2013.01); *H01L 24/02* (2013.01); *H01L 24/13* (2013.01); *H01L 24/24* (2013.01); *H01L 24/25* (2013.01); *H01L 24/32* (2013.01); *H01L 25/0655* (2013.01); *H01L 25/0657* (2013.01);
(Continued)

(58) Field of Classification Search
None
See application file for complete search history.

(56) References Cited

U.S. PATENT DOCUMENTS 9,773,757 B2 9/2017 Yu et al.
2006/0268144 A1 11/2006 Tan et al.
(Continued)

FOREIGN PATENT DOCUMENTS

CN 1905144 A 1/2007
CN 104418291 A 3/2015
(Continued)

OTHER PUBLICATIONS

Office Action issued in corresponding Korean Patent Application No. 10-2017-0162144, dated Sep. 17, 2018.
(Continued)

*Primary Examiner* — Jack S Chen
(74) *Attorney, Agent, or Firm* — Sughrue Mion, PLLC

(57) ABSTRACT

A fan-out semiconductor package includes a first connection member having a through-hole, a semiconductor chip disposed in the through-hole and including an active surface having connection pads disposed thereon and an inactive surface opposing the active surface, a second connection member disposed on the active surface of the semiconductor chip and including a redistribution layer electrically connected to the semiconductor chip, and an encapsulant encapsulating the semiconductor chip and having a cavity disposed above the inactive surface of the semiconductor chip.

6 Claims, 16 Drawing Sheets

(51) Int. Cl.
  *H01L 25/18* (2006.01)
  *H01L 25/10* (2006.01)
  *H01L 25/065* (2006.01)
  *H01L 21/56* (2006.01)
  *H01L 23/538* (2006.01)
  *H01L 23/13* (2006.01)
  *H01L 23/498* (2006.01)

(52) U.S. Cl.
  CPC ............ *H01L 25/105* (2013.01); *H01L 25/18* (2013.01); *H01L 23/49816* (2013.01); *H01L 2224/02331* (2013.01); *H01L 2224/02379* (2013.01); *H01L 2224/04105* (2013.01); *H01L 2224/12105* (2013.01); *H01L 2224/13024* (2013.01); *H01L 2224/24137* (2013.01); *H01L 2224/24155* (2013.01); *H01L 2224/24195* (2013.01); *H01L 2224/25171* (2013.01); *H01L 2224/32145* (2013.01); *H01L 2224/32245* (2013.01); *H01L 2224/32265* (2013.01); *H01L 2224/73267* (2013.01); *H01L 2225/0651* (2013.01); *H01L 2225/06524* (2013.01); *H01L 2225/06558* (2013.01); *H01L 2225/06586* (2013.01); *H01L 2225/1023* (2013.01); *H01L 2225/1035* (2013.01); *H01L 2225/1058* (2013.01); *H01L 2225/1088* (2013.01); *H01L 2924/1461* (2013.01); *H01L 2924/15321* (2013.01); *H01L 2924/1815* (2013.01); *H01L 2924/18162* (2013.01); *H01L 2924/19102* (2013.01); *H01L 2924/19105* (2013.01)

(56) References Cited

U.S. PATENT DOCUMENTS

| | | |
|---|---|---|
| 2010/0019368 A1 | 1/2010 | Shin |
| 2011/0062578 A1 | 3/2011 | Katagiri et al. |
| 2014/0093999 A1 | 4/2014 | Teh et al. |
| 2015/0061048 A1 | 3/2015 | Escher-Poeppel et al. |
| 2015/0221577 A1* | 8/2015 | Liou ................ H01L 23/147 |
| | | 257/692 |
| 2016/0043047 A1 | 2/2016 | Shim et al. |
| 2016/0133538 A1 | 5/2016 | Yu et al. |
| 2017/0103951 A1 | 4/2017 | Lee et al. |
| 2017/0148767 A1 | 5/2017 | Hung et al. |
| 2017/0330840 A1 | 11/2017 | Lin et al. |

FOREIGN PATENT DOCUMENTS

| | | |
|---|---|---|
| CN | 104868872 A | 8/2015 |
| CN | 107039369 A | 8/2017 |
| JP | 2011-61116 A | 3/2011 |
| KR | 10-2008-0038719 A | 5/2008 |
| KR | 10-2010-0011648 A | 2/2010 |
| KR | 10-2013-0015461 A | 2/2013 |
| KR | 10-2015-0038312 A | 4/2015 |
| KR | 10-2017-0043440 A | 4/2017 |
| KR | 10-2017-0072425 A | 6/2017 |
| TW | 201618196 A | 5/2016 |

OTHER PUBLICATIONS

Taiwanese Office Action dated Mar. 6, 2019 issued in Taiwanese Patent Application No. 107119317 (with English translation).

* cited by examiner

FAN-OUT SEMICONDUCTOR PACKAGE

CROSS-REFERENCE TO RELATED APPLICATION(S)

This application claims benefit of priority to Korean Patent Application No. 10-2017-0162144 filed on Nov. 29, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand as described above is a fan-out semiconductor package. Such a fan-out package has a compact size and may allow a plurality of pins to be implemented by redistributing connection terminals outwardly of a region in which a semiconductor chip is disposed.

Such a semiconductor package may be implemented in a form of a multichip package in which a plurality of semiconductor chips, passive elements, or the like are packaged simultaneously, and in this case, a thickness and a size of the package may be increased.

SUMMARY

An aspect of the present disclosure may provide a fan-out semiconductor package suitable for thinness and high integration.

According to an aspect of the present disclosure, a fan-out semiconductor package may include a first connection member having a through-hole, a first semiconductor chip disposed in the through-hole and including an active surface having connection pads disposed thereon and an inactive surface opposing the active surface, a second connection member disposed on the active surface of the first semiconductor chip and including a redistribution layer electrically connected to the semiconductor chip, and an encapsulant encapsulating the first semiconductor chip and having a cavity disposed above the inactive surface of the semiconductor chip.

The fan-out semiconductor package may further include an adhesive layer disposed on the inactive layer of the first semiconductor chip.

The cavity may have a width greater than that of the semiconductor chip.

The an-out semiconductor package may further include a second semiconductor chip disposed side-by-side with the first semiconductor chip in the through hole.

The fan-out semiconductor package may further include a passive element disposed to be adjacent to the first semiconductor chip and having an upper surface exposed by the cavity.

The fan-out semiconductor package may further include a printed circuit board disposed on the first connection member to cover the cavity.

The fan-out semiconductor package may further include an additional semiconductor chip disposed on a lower surface of the printed circuit board and positioned in the cavity.

The fan-out semiconductor package may further include an additional semiconductor chip disposed on an upper surface of the printed circuit board.

The fan-out semiconductor package may further include a passive element disposed on a lower surface of the printed circuit board and positioned in the cavity.

The fan-out semiconductor package may further include an additional semiconductor chip embedded in the printed circuit board.

The fan-out semiconductor package may further include a passive element disposed on a lower surface of the printed circuit board to be positioned in the cavity.

The printed circuit board may be an antenna or a sensor board.

The fan-out semiconductor package may further include an additional semiconductor chip disposed on the inactive surface of the first semiconductor chip and positioned in the cavity.

The fan-out semiconductor package may further include a third connection member disposed on the first connection member and electrically connected to the additional semiconductor chip.

The fan-out semiconductor package may further include a conductive wire connected to the additional semiconductor chip and a molding portion encapsulating the conductive wire.

The fan-out semiconductor package may further include an additional semiconductor chip disposed on the first connection member and positioned on the cavity and a molding portion encapsulating the additional semiconductor chip.

The additional semiconductor chip may be a micro electro mechanical system (MEMS) element, and the cavity may be in a vacuum state.

The fan-out semiconductor package may further include a heat radiation portion disposed in the cavity and boned to the first semiconductor chip.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
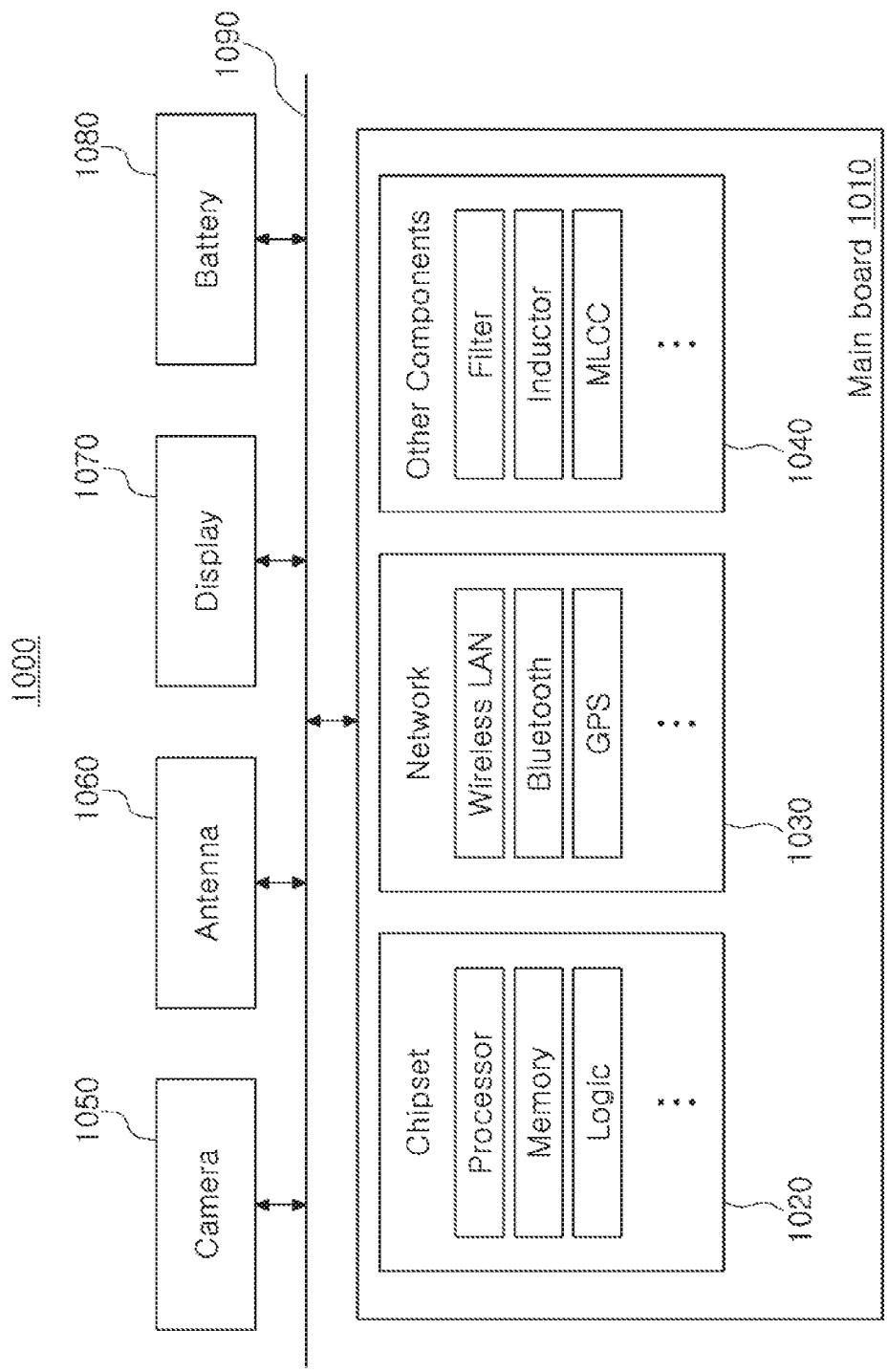
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
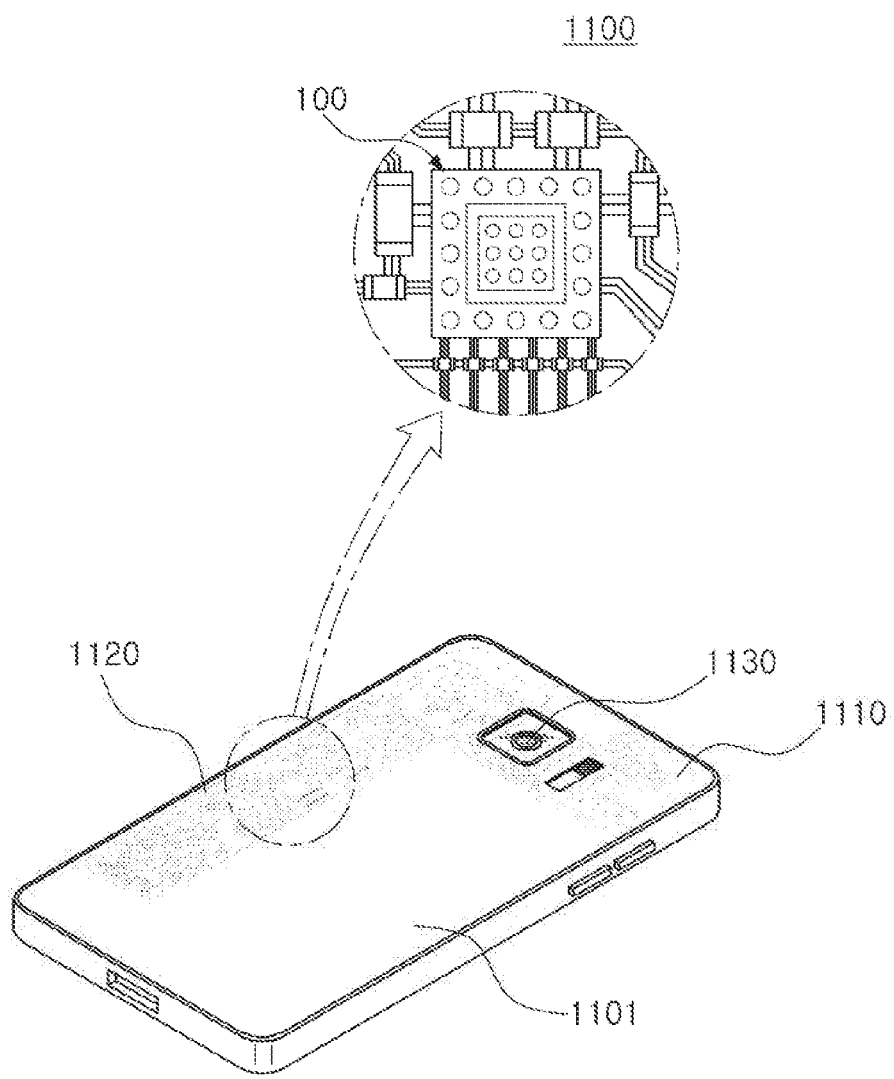
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mother board 1110 may be accommodated in a body 1101 of a smartphone 1100, and various components 1120 may be physically or electrically connected to the mother board 1110. In addition, other components that may or may not be physically or electrically connected to the main board 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

(Fan-In Semiconductor Package)

Figure 3B:
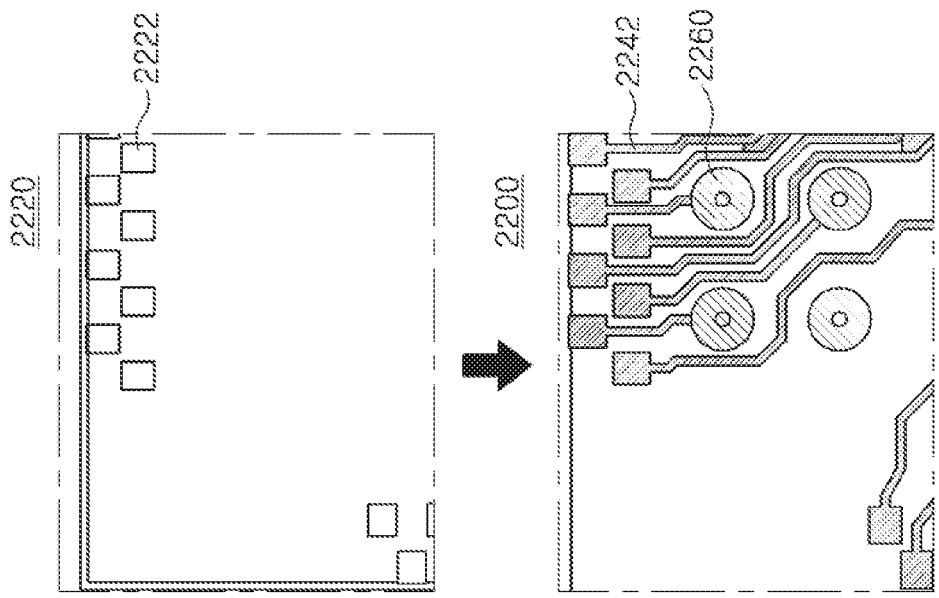
FIGS. 3A and 3B are schematic cross-sectional views illustrating states of a fan-in semiconductor package before and after being packaged.
Figure 3A:
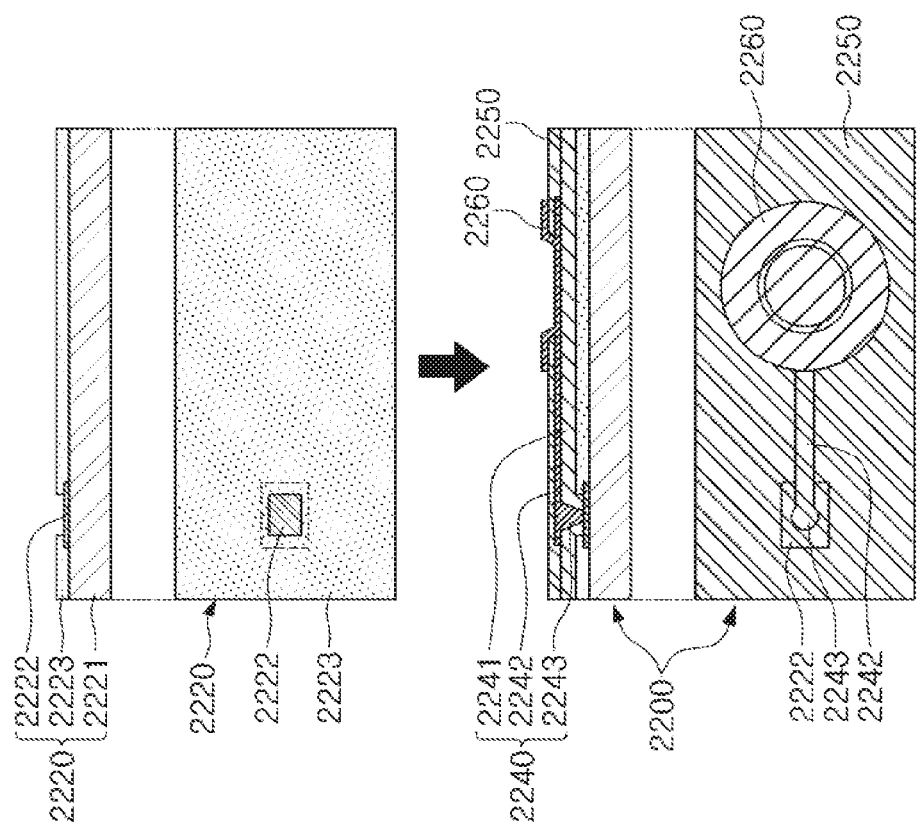

FIGS. 3A and 3B are schematic cross-sectional views illustrating states of a fan-in semiconductor package before and after being packaged.

Figure 4:
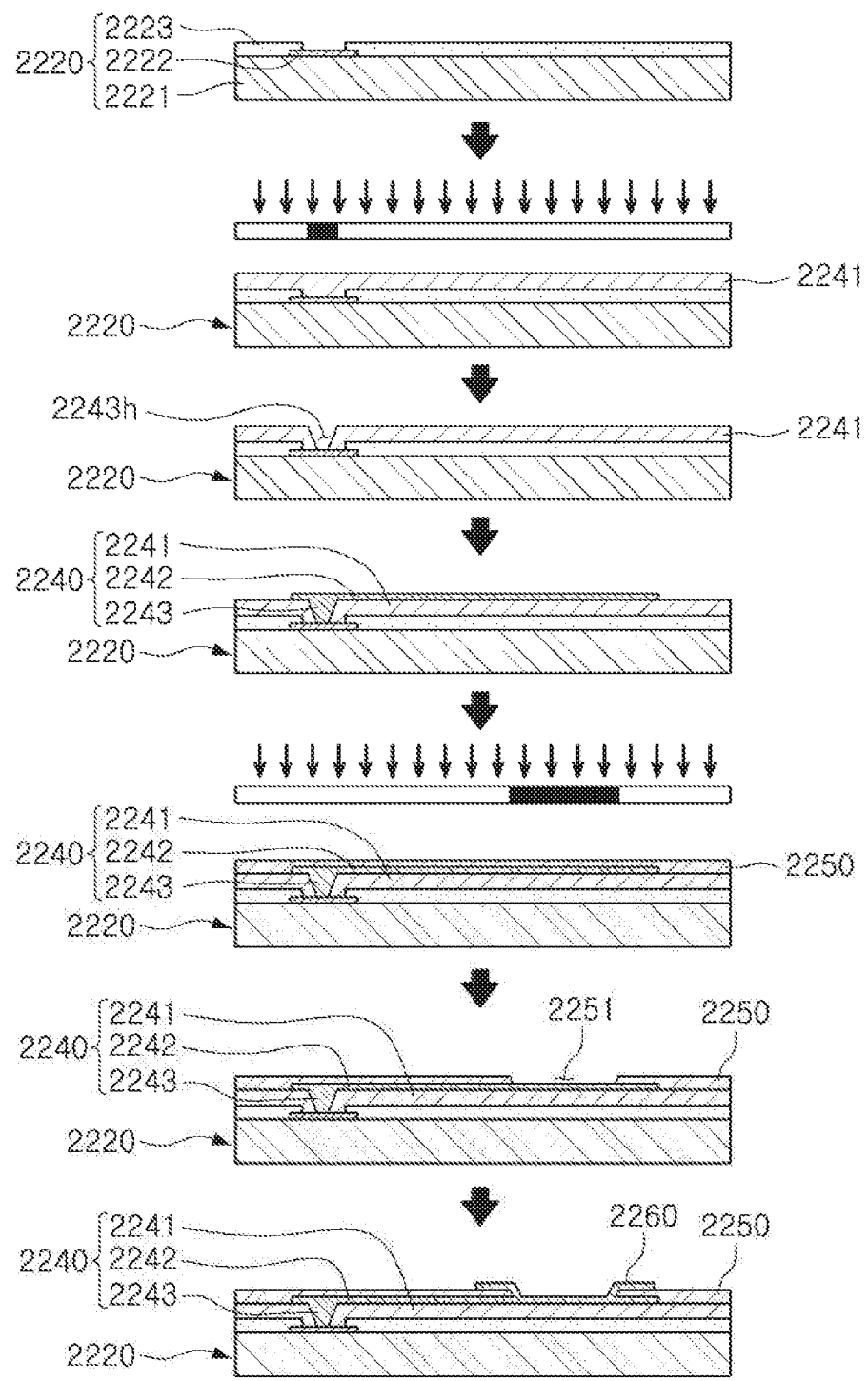
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
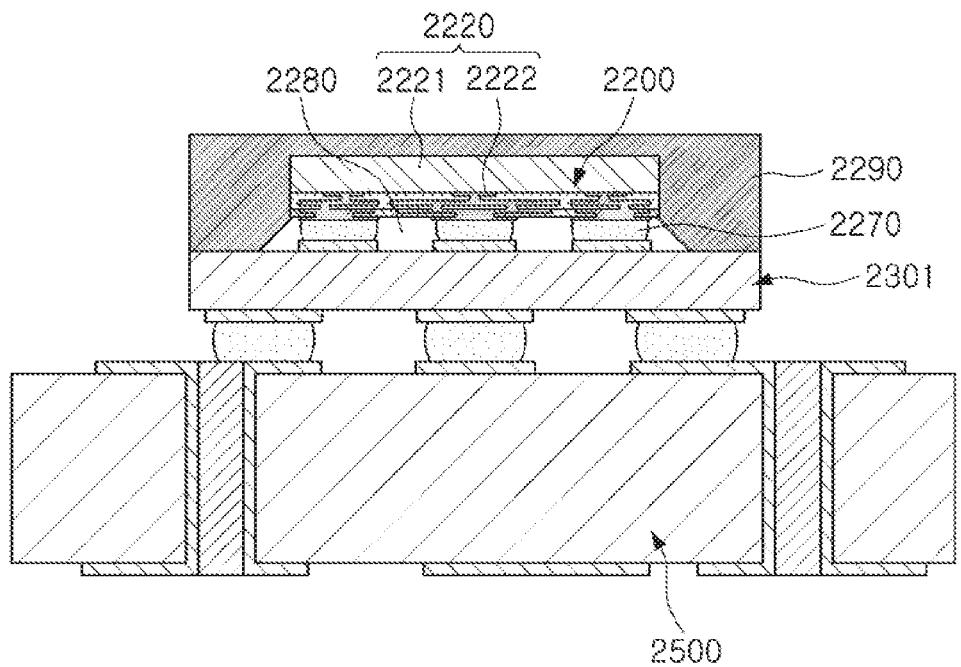
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
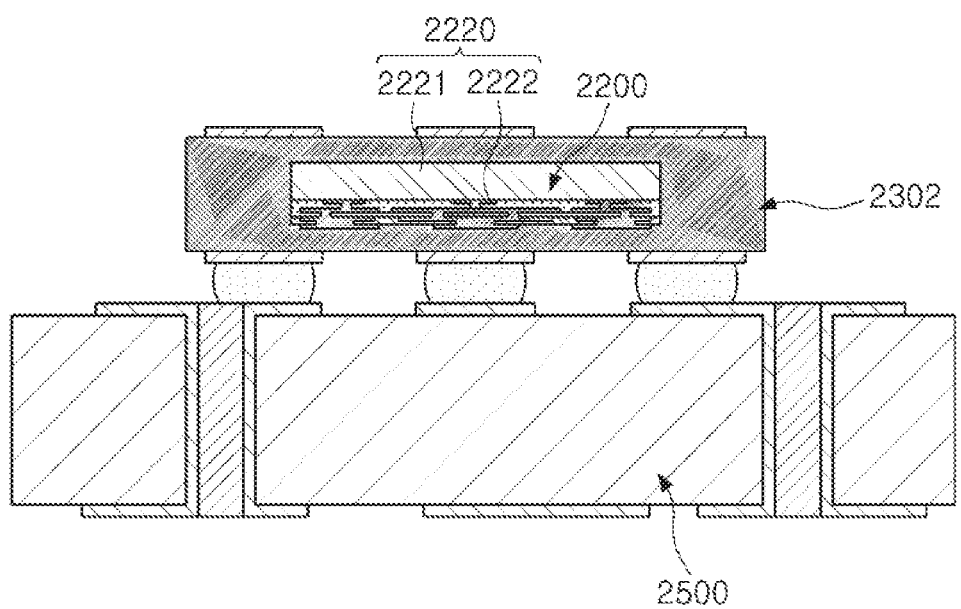
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

(Fan-Out Semiconductor Package)

Figure 7:
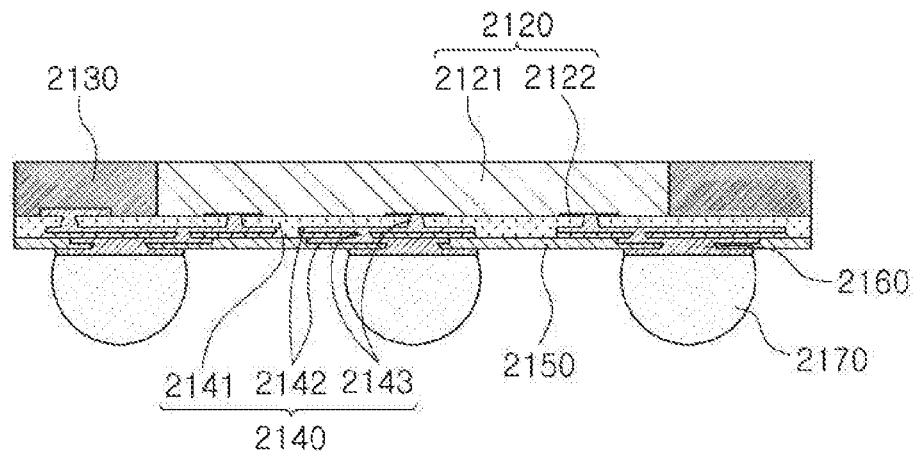
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may be further formed on the connection member 2104, and an underbump metal layer 2106 may be further formed in openings of the passivation layer 2202. Solder balls 2170 may be further formed on the underbump metal layer 2160. The semiconductor chip 2120 may be an integrated circuit (IC) including a body 2121, the connection pads 2122, a passivation layer (not illustrated), and the like.

The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
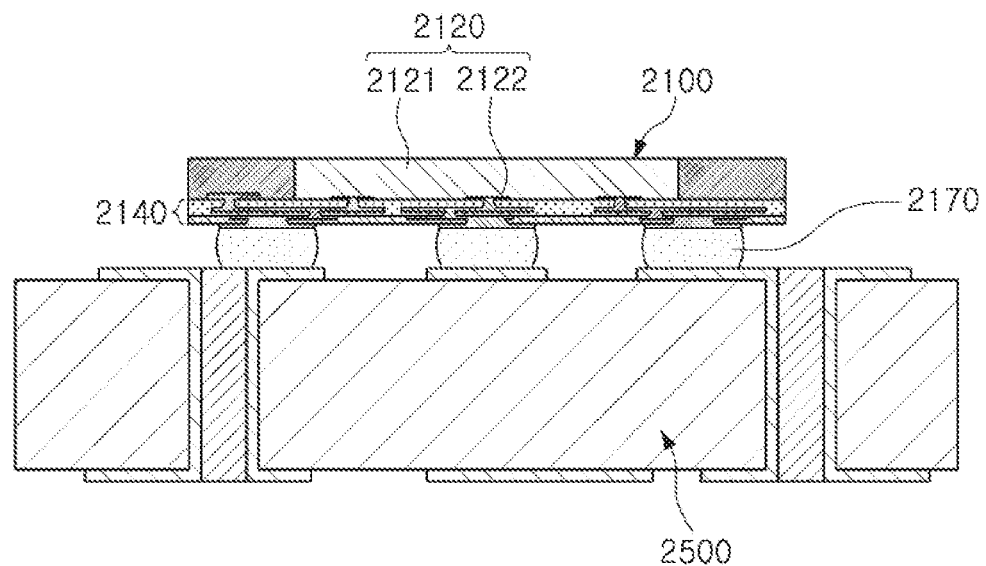
FIG. 8 is a schematic cross-sectional view illustrating a case in which a fan-out semiconductor package is mounted on amain board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package according to exemplary embodiment in the present disclosure will hereinafter be described with reference to the drawings.

Figure 9:
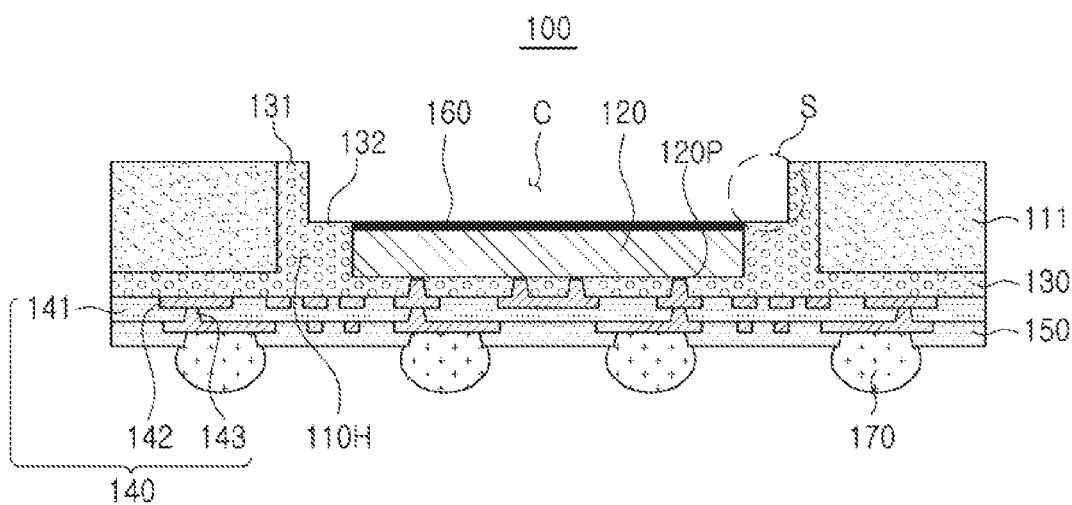
FIG. 9 is a schematic cross-sectional view illustrating an example of a fan-out semiconductor package.
Figure 10:
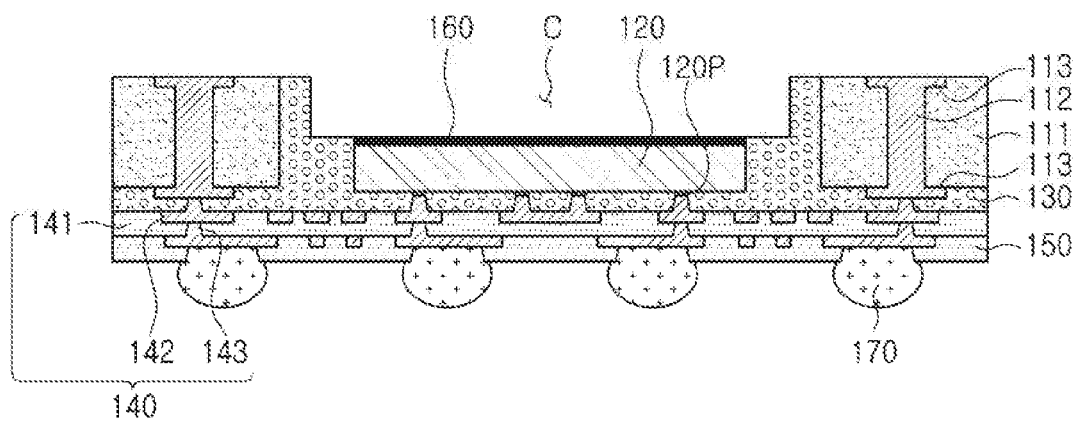
FIG. 10 illustrates a modified example of the fan-out semiconductor package of FIG. 9.

FIG. 9 is a schematic cross-sectional view illustrating an example of a fan-out semiconductor package. FIG. 10 illustrates a modified example of the fan-out semiconductor package of FIG. 9.

Referring to the drawings, a fan-out semiconductor package 100 according to an exemplary embodiment in the present disclosure may include a first connection member 111 having a through-hole 110H, a semiconductor chip 120, an encapsulant 130, and a second connection member 140. The encapsulate 130 may have a cavity C exposing one surface of the semiconductor chip 120. The cavity C may be a recess of the encapsulant 130 formed by a step S between an upper outer surface 131 of the encapsulant 130 and an intermediate inner surface 132 of the encapsulant 130. The encapsulant 130 may not cover the inactive surface of the semiconductor chip 120. The encapsulant 130 may cover side surfaces of the semiconductor chip. In a case in which an adhesive layer 160 is attached to the inactive surface of the semiconductor chip 120, the intermediate inner surface 132 of the encapsulant 130 and an upper surface of the adhesive layer 160 may be substantially coplanar with each other, and the cavity C may expose the entire upper surface of the adhesive layer 160. In a case in which such an adhesive layer does exist, the intermediate inner surface 132 of the encapsulant 130 and the inactive surface of the semiconductor chip 120 may be substantially coplanar with each other, and the cavity C may expose the entire inactive surface of the semiconductor chip 120. "Substantially" or "approximately" means that tolerance/errors/variations caused by manufacturing processes are considered to define a respective relationship. In addition to the components described above, the fan-out semiconductor package 100 may include a passivation layer 150, electrical connection structures 170, and the like.

The first connection member 110 may further improve rigidity of the fan-out semiconductor package 100 depending on certain materials, and serve to secure uniformity of a thickness of the encapsulant 130. When through-wirings, or the like, are formed in the first connection member 110 as in an exemplary embodiment to be described below, the fan-out semiconductor package 100 may be utilized as a package-on-package (POP) type package. According to the present disclosure, the first connection member 110 may include the through-hole 110H and the semiconductor chip 120 may be disposed in the through-hole 110H. Side surfaces of the semiconductor chip 120 may be surrounded by the first connection member 110. However, such a form is only an example and may be variously modified to have other forms, and the first connection member 110 may perform another function depending on such a form. The first connection member 110 may be omitted, if necessary, but it may be more advantageous in securing the board level reliability when the fan-out semiconductor package 100 includes the first connection member 110.

An insulating material may be used as a material of an insulating layer forming the first connection member 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth, or a glass fabric), for example, prepreg, Ajinomoto Build up Film (ABF), FR-4, Bismaleimide Triazine (BT), or the like. Such a first connection member 110 may serve as a support member.

Meanwhile, as illustrated in a modified example of FIG. 10, the first connection member 111 may include through-wirings 112 and 113. In this case, the fan-out semiconductor package 100 may be utilized as a POP type package. In detail, the first connection member 111 may include wiring layers 113 and conductive vias 112 connected to the wiring layers 113. Although FIG. 10 illustrates that the wiring layers 113 are formed on only an upper surface and a lower surface of the insulating layer of the first connection member 111, the wiring layers 113 may also be formed in the insulating layer.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed.

The semiconductor chip 120 may be formed on the basis of an active wafer. In this case, a base material of a body may be silicon (Si), germanium (Ge), gallium arsenide (GaAs), or the like. Various circuits may be formed on the body. The connection pads may electrically connect the semiconductor chip 120 to other components. A material of each of connection pads 120P of the semiconductor chip may be a conductive material such as aluminum (Al), or the like. The semiconductor chip 120 may be a bare die, a redistribution layer (not illustrated) may be further formed on the active surface of the semiconductor chip 120, if necessary, and bumps (not illustrated), or the like, may be connected to the connection pads 120P.

The encapsulant 130 may protect the first connection member 110, the semiconductor chip 120, and the like. An encapsulation form of the encapsulant 130 is not particularly limited, but may be a form in which the encapsulant 130 surrounds at least portions of the first connection member 110, the semiconductor chip 120, and the like. The encapsulant 130 may fill spaces between wall surfaces of the through-hole 110H and side surfaces of the semiconductor chip 120, and thus serve as an adhesive and reduce buckling of the semiconductor chip 120. According to the present exemplary embodiment, the encapsulant 130 may have the cavity C exposing an inactive surface (an upper surface in FIG. 9) of the semiconductor chip 120. As the inactive surface of the semiconductor chip 120 is exposed, heat radiation performance of the fan-out semiconductor package 100 may be improved. Further, as described below, the cavity C is used as a region for the semiconductor chip, the passive element, a heat radiation structure, vacuum, and the like, such that the fan-out semiconductor package 100 having a high degree of integration may be effectively implemented. For such an integrated structure, the adhesive layer 160 may be disposed on the inactive surface of the semiconductor chip 120. A material of the adhesive layer 160 may be various materials. For example, a polymer, a double-sided tape, or the like having excellent adhesion performance may be used. In addition, for an efficient layout, a width of the cavity C may be greater than that of the semiconductor chip as illustrated in FIG. 9.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material.

The second connection member 140 may redistribute the connection pads 120P of the semiconductor chip 120. Several tens to several hundreds of connection pads 120P of the semiconductor chip 120 having various functions may be redistributed by the second connection member 140, and may be physically or electrically externally connected through the electrical connection structures 170 depending on the functions. To this end, the second connection member 140 may include an insulating layer 141, a redistribution layer 142, and conductive vias 143. However, the number of redistribution layer 142, insulating layer, and vias 143 may be changed, if necessary.

As an insulating material included in the insulating layer 141, for example, a PID material may be used. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 121 may be integrated with each other depending on a process, such that a boundary therebetween may also not be apparent. A larger number of insulating layers than those illustrated in the drawing may be formed.

The redistribution layer 142 may serve to redistribute the connection pads 120P of the semiconductor chip 120, and a material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on designs of a corresponding layer. For example, the redistribution layer 142 may include ground patterns, signal patterns, and the like. Here, the signal patterns may include various signals except for the ground patterns, the power patterns, and the like, such as data signals, and the like. In addition, the redistribution layer 142 may include via pad patterns, connection terminal pad patterns, and the like.

The vias 143 may electrically connect the redistribution layer 142, the connection pads, or the like, formed on different layers to each other, resulting in an electrical path in the fan-out semiconductor package 100. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

A passivation layer 150 may protect the second connection member 140 from external physical or chemical damage, or the like. The passivation layer 150 may have openings exposing at least a portion of the redistribution layer 142 of the second connection member 140. The number of openings formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

The electrical connection structures 170 may physically or electrically externally connect the fan-out semiconductor package 100. For example, the fan-out semiconductor package 100 may be mounted on the main board of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads, or may be provided in an amount of several tens to several thousands or more or several tens to several thousands or less. When the electrical connection structures 170 are solder balls, the electrical connection structures 170 may cover side surfaces extending onto one surface of the passivation layer 150, and connection reliability may be more excellent.

At least one of the electrical connection structures 170 may be disposed in a fan-out region. The fan-out region is a region except for a region in which the semiconductor chip 120 is disposed. The fan-out package may have reliability greater than that of a fan-in package, may implement a plurality of I/O terminals, and may easily perform 3D interconnection In addition, as compared to a ball grid array (BGA) package, a land grid array (LGA) package, or the like, the fan-out package may be manufactured to have a small thickness, and may have price competitiveness.

A fan-out semiconductor package according to a modified example will hereinafter be described with reference to FIGS. 11 through 21. Elements and the like disposed around the cavity C will be mainly addressed.

Figure 11:
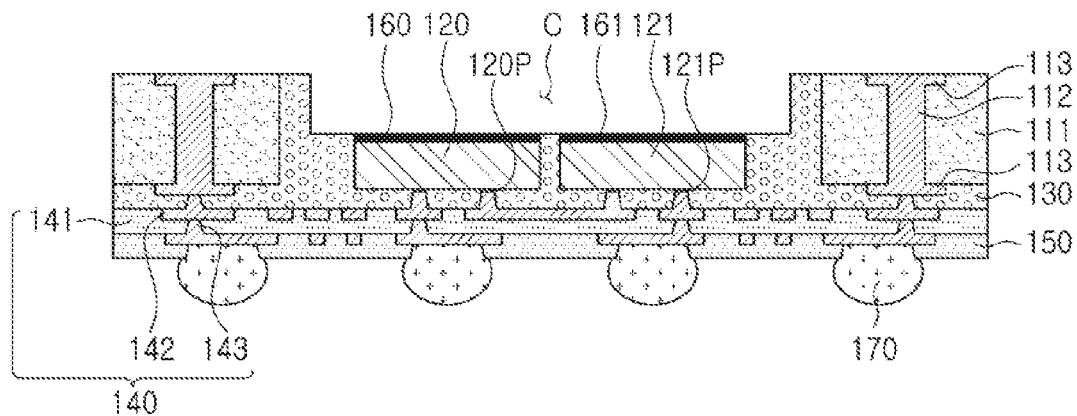
FIGS. 11 through 21 schematically illustrate a fan-out semiconductor package according to each of the modified examples.

According to an exemplary embodiment of FIG. 11, the fan-out semiconductor package may include first and second semiconductor chips 120 and 121 disposed in parallel to each other, and adhesive layers 160 and 161 may be disposed on the respective exposed inactive surfaces of the first and second semiconductor chips 120 and 121. The fan-out semiconductor package may be implemented in a multichip package in which a plurality of semiconductor chips 120 and 121 are packaged, thereby improving performance of the fan-out semiconductor package. In this case, the numbers of semiconductor chips 120 and 121 may be further increased, if necessary.

Figure 12:
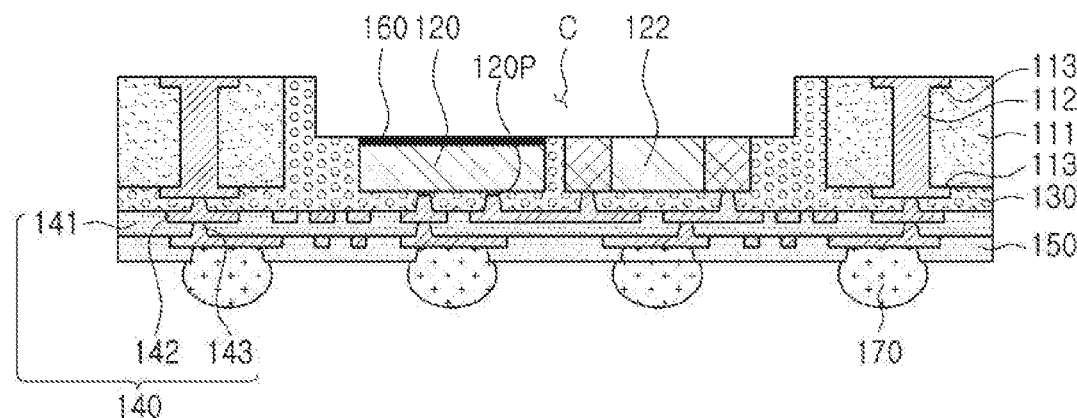

An exemplary embodiment of FIG. 12 illustrates a structure in which the passive element 122 is disposed to be adjacent to the semiconductor chip 120. The passive element 122 may be a capacitor, an inductor, a resistor, or the like, and the same kind or other kinds of a plurality of passive elements may also be used, if necessary. The passive element 122 may be disposed to be adjacent to the semiconductor chip 120, and an upper surface of the passive element 122 may be exposed by the cavity C in the same way as the semiconductor chip 120. However, unlike the semiconductor chip 120, the adhesive layer 160 may not be disposed on the exposed surface of the passive element 122.

Figure 13:
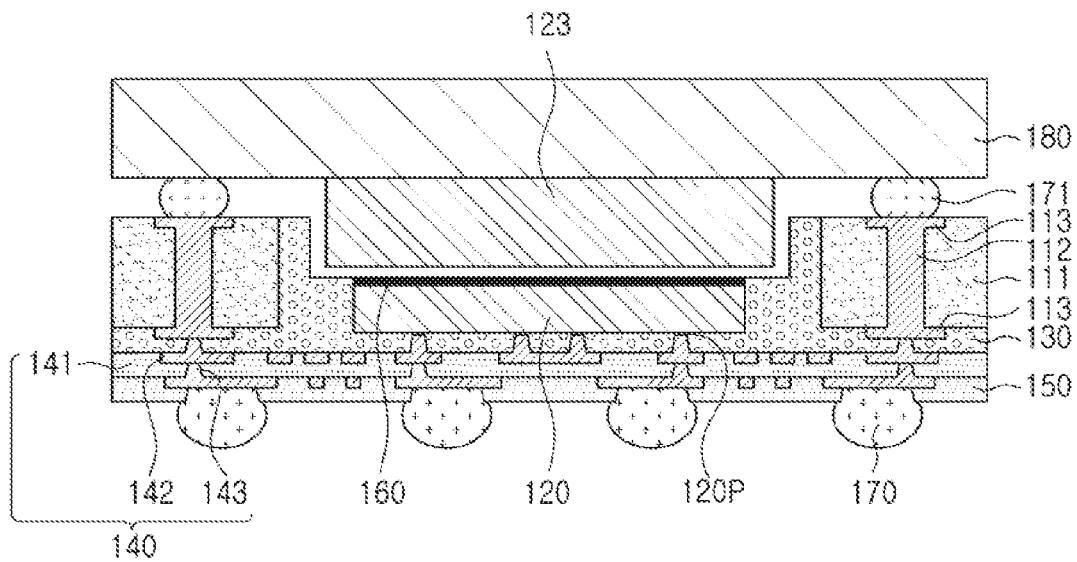

Next, an exemplary embodiment of FIG. 13 illustrates a structure in which a printed circuit board 180 is disposed on a first connection member 111. The printed circuit board 180 may be a structure covering the cavity. As an example, the printed circuit board 180 may be connected to the wiring layer 113 and the conductive vias 112 of the first connection member 111 by the electrical connection structures 171. The printed circuit board 180 may be an antenna board or a sensor board, and in addition to this, boards performing various functions may be used. In addition, an additional semiconductor chip 123 may be disposed on a lower surface of the printed circuit board 180 so as to be positioned in the cavity of the encapsulant 130. As such, a multichip structure having improved spatial efficiency may be implemented by adjusting a layout direction of the printed circuit board 180 on which the semiconductor chip 123 is mounted. Accordingly, the fan-out semiconductor package may be miniaturized and thinned, and a pitch of each of the electrical connection structures 170 included in the fan-out semiconductor package may be reduced. Meanwhile, although FIG. 13 illustrates a form in which the additional semiconductor chip 123 is not bonded to the semiconductor chip 120, a structure in which the additional semiconductor chip 123 and the semiconductor chip 120 are bonded to each other may also be formed by the adhesive layer 160.

Figure 14:
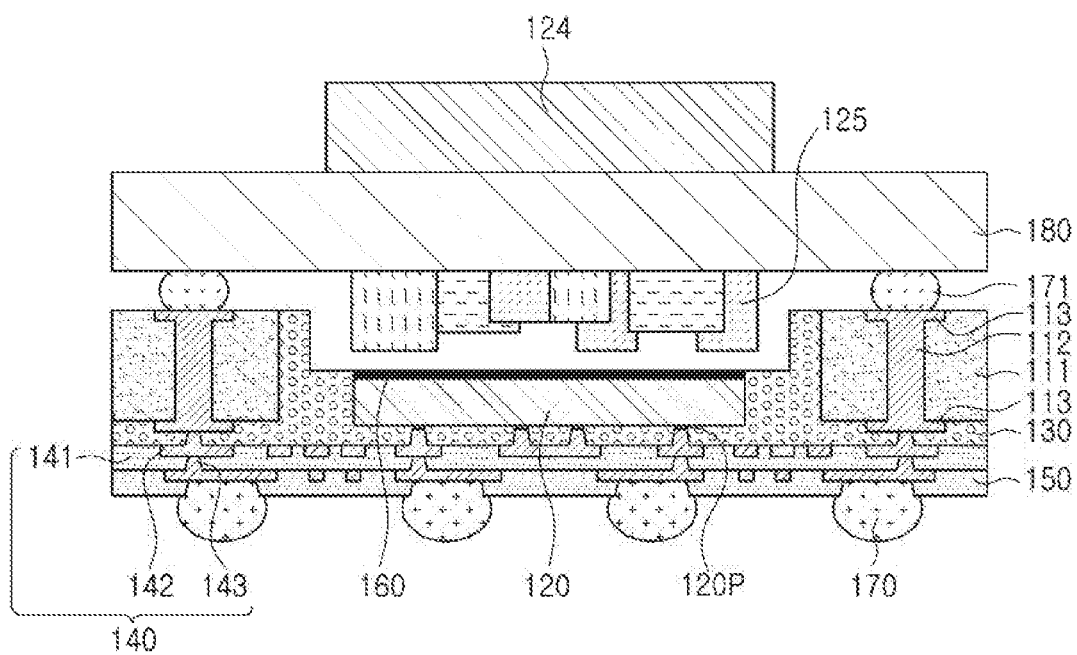

An exemplary embodiment of FIG. 14 illustrates a structure in which an additional semiconductor chip 124 is disposed on an upper surface of the printed circuit board 180, that is, a surface which is not directed to the cavity, and the passive element 125 is disposed on a lower surface of the printed circuit board 180 so as to be positioned in the cavity of the encapsulant 130. In this case, as in the illustrated form, a plurality of passive elements 125 may be formed and disposed in the cavity, thereby improving spatial efficiency. Meanwhile, although FIG. 14 illustrates a form in which the passive elements 125 are not bonded to the semiconductor chip 120, a structure in which the passive elements 125 and the semiconductor chip 120 are bonded to each other may also be formed by the adhesive layer 160.

Figure 15:
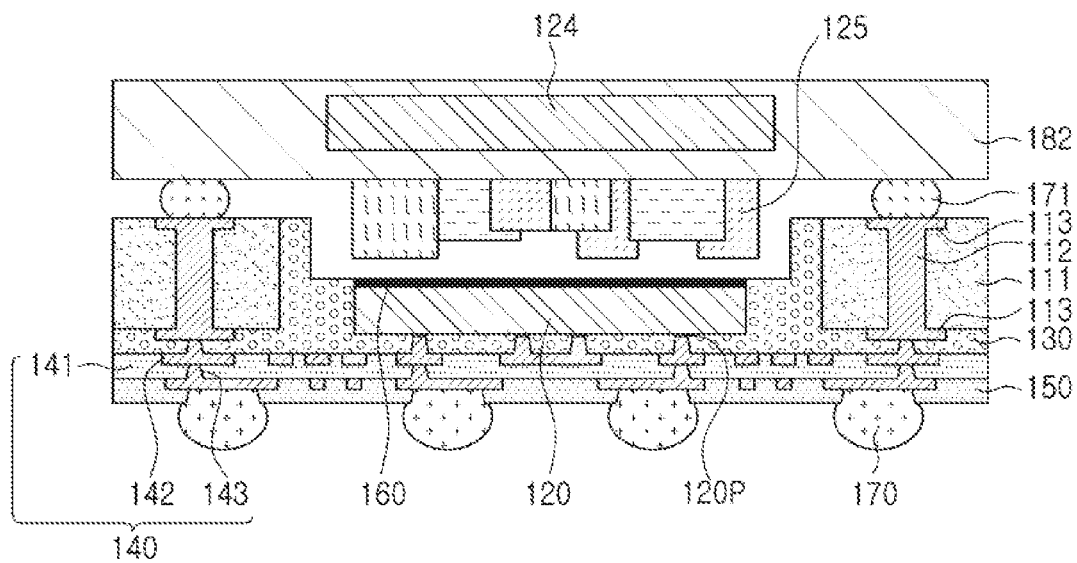

As another example of a layout of the semiconductor chip 124, as in an exemplary embodiment of FIG. 15, the additional semiconductor chip 124 may be embedded in the printed circuit board 182. In this case, the passive element 125 may be disposed on the lower surface of the printed circuit board 182 so as to be positioned in the cavity of the encapsulant 130.

Figure 16:
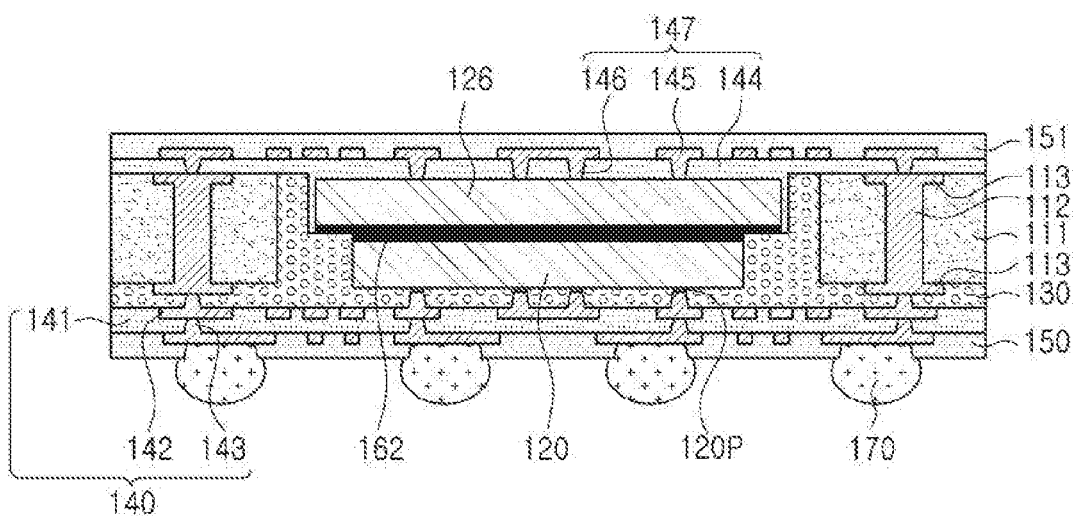

Next, an exemplary embodiment of FIG. 16 illustrates a stack structure in which a plurality of semiconductor chips 120 and 126 are laminated. An additional semiconductor chip 126 may be disposed on the inactive surface of the semiconductor chip 120 so as to be positioned in the cavity, and a bonded structure in which the additional semiconductor chip 126 and the semiconductor chip 120 are bonded to each other may be formed by the adhesive layer 162. In this case, the adhesive layer 162 may be applied to the inactive surface of each of the semiconductor layer 120 and the additional semiconductor layer 126, and the semiconductor chip 120 and the additional semiconductor chip 126 may be then bonded to each other. A third connection member 147 may be disposed on the first connection member 111 to be electrically connected to the additional semiconductor chip 126, or the like, and may include an insulating layer 144, a wiring layer 145, and conductive vias 146. In this case, the third connection member 147 may be implemented in the same way as the second connection member 140. In addition, a passivation layer 151 protecting the third connection member 147 may be formed on the third connection member 147.

Figure 17:
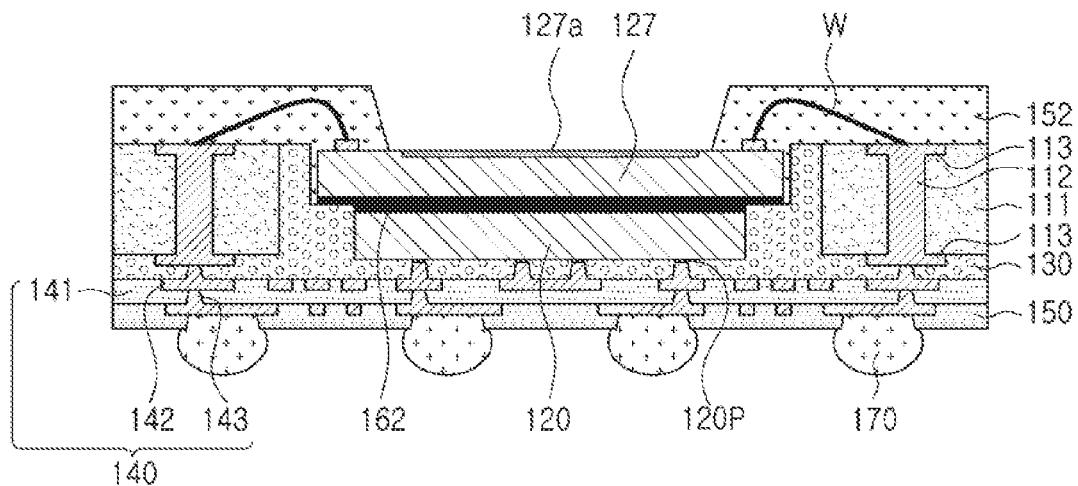

As another example of a stack structure of the semiconductor chips, an exemplary embodiment of FIG. 17 illustrates a sensor package structure which may be used in a camera module, or the like. An additional semiconductor chip 127 may be a sensor package including a sensing region 127a, and in order to use the semiconductor chip 120 as the sensor package, the semiconductor chip 120 may be an application specific integrated circuit (ASIC), a memory, or the like. As illustrated, the additional semiconductor chip 127 may be connected to the wiring layer 113 by a conductive wire W. In addition, a molding portion 152 formed of an insulating material may be formed to encapsulate the conductive wire W. In this case, a portion of the molding portion 152 may be removed to expose a sensing region 127a.

Figure 18:
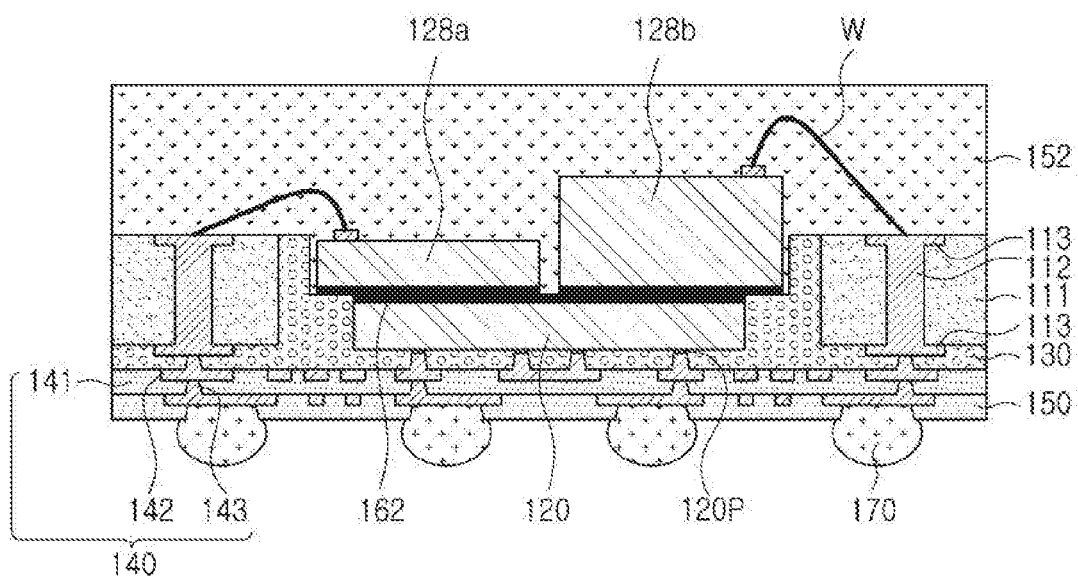

As another example, an exemplary embodiment of FIG. 18 illustrates a structure in which a plurality of semiconductor chips 128a and 128b are disposed in the cavity. In this case, each of the semiconductor chips 128a and 128b may be connected to the wiring layer 113 by the conductive wire W, and the molding portion 152 may encapsulate the semiconductor chips 128a and 128b and the conductive wire W. In this case, the molding portion 152 may fill the remaining regions of the cavity of the encapsulant 130.

Figure 19:
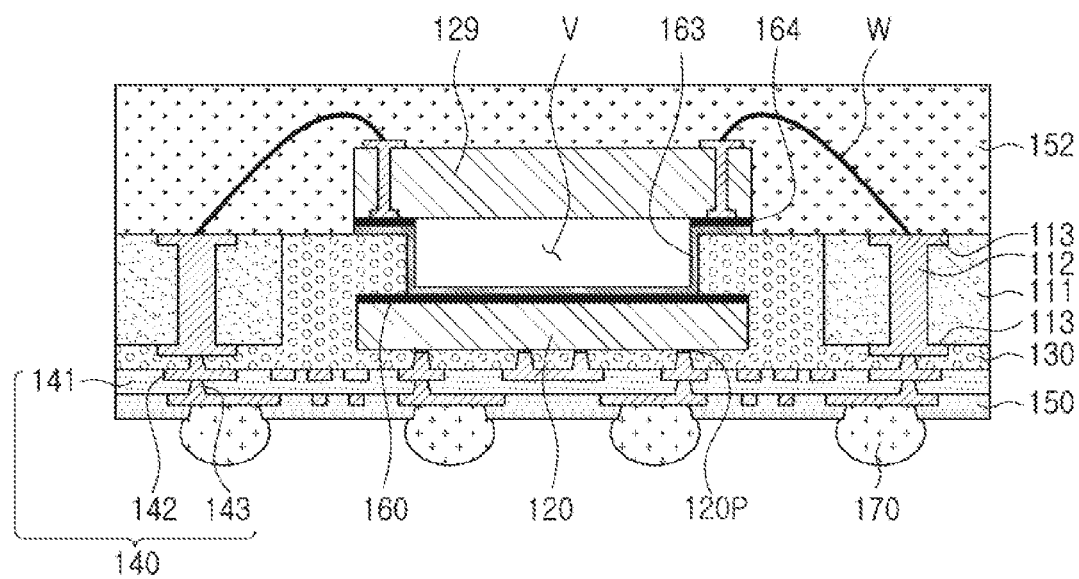
Figure 20:
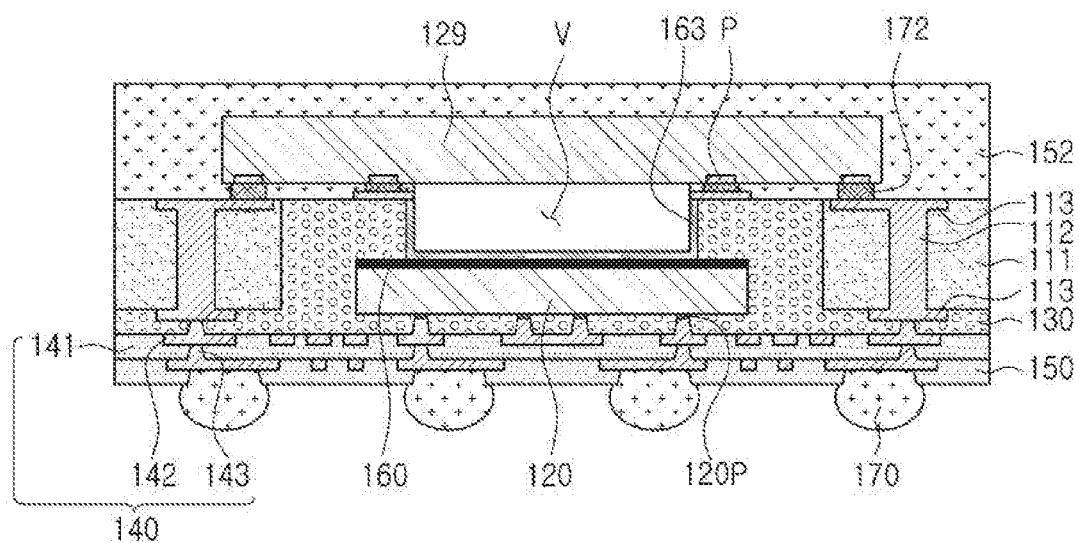

The fan-out semiconductor package having the cavity may be applied to an element performing a function different from that described above. An exemplary embodiment of FIG. 19 illustrates a case in which an additional semiconductor chip 129 is a micro electromechanical system (MEMS) element, and such an MEMS element may be a piezoelectric package, or the like that generates an electrical signal according to a change in pressure. The adhesive layer 160 and the semiconductor chip 120 may be partially covered by the encapsulant 130. In addition, in order to allow the MEMS element to effectively operate, the cavity of the encapsulant 130 may be in a vacuum state V. In order to implement a vacuum region V, a sealing layer 163 may be disposed in the cavity. Such a vacuum region V may serve as a silicon cap used in a conventional MEMS element. In addition, in order to stably mount an additional semiconductor chip 129, an adhesive layer 164 may be used. Unlike the exemplary embodiment of FIG. 19 in which the electrical connection structures are implemented using the conductive wire W, the electrical connection structures may also be directly connected to each other as in an exemplary embodiment of FIG. 20. In detail, the additional semiconductor chip 129 may have pads P disposed directed to the cavity, and may be connected to the wiring layer 113 or the like by the electrical connection structures 172.

Figure 21:
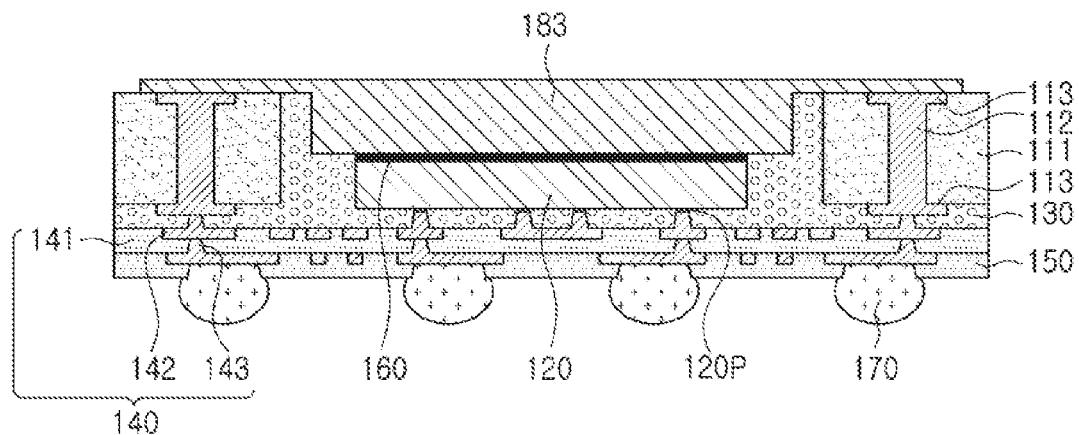

Next, an exemplary embodiment of FIG. 21 illustrates a structure in which a heat radiation portion 183 instead of the semiconductor chip or the passive element is disposed in the cavity to maximize a heat radiation effect. The heat radiation portion 183 may be formed in the cavity and bonded to the semiconductor chip 120, and may be formed of a metal such as silver (Ag), aluminum (Al), copper (Cu), nickel (Ni), or the like, graphene, or the like. In order to further improve the heat radiation effect, the heat radiation portion 183 may fill the entirety of the cavity, and may extend to an upper portion of the first connection member 111 to be connected to the wiring layer 113.

An example of a process of manufacturing a fan-out semiconductor package based on a method for forming a cavity will hereinafter be described with reference to FIGS. 22 through 25.

Figure 22:
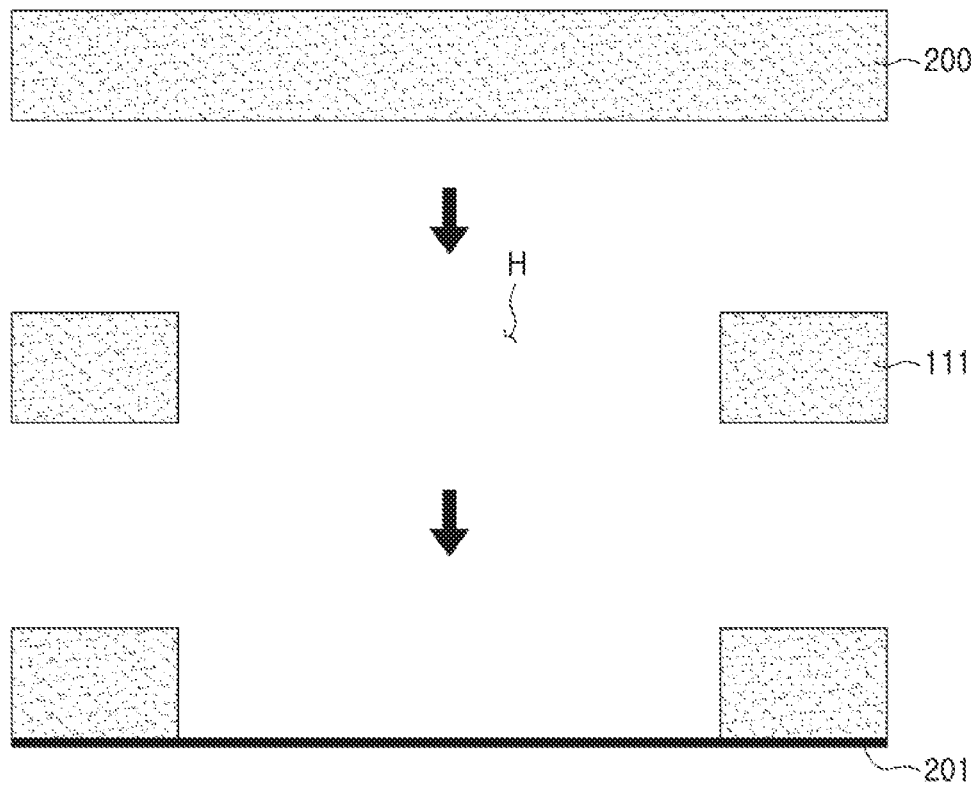
FIGS. 22 through 25 illustrate an example of a process of manufacturing a fan-out semiconductor package.

First, a frame 200 may be prepared, a through-hole H may be formed, and a first connection member 111 may be formed. Although FIG. 22 illustrates only an insulating layer of the first connection member 111, the wiring layer, the conductive vias, ant like described above may be included in the first connection member 111. Next, a tape 201 may be attached to the first connection member 111 and this is to dispose a semiconductor chip, and the like.

Figure 23:
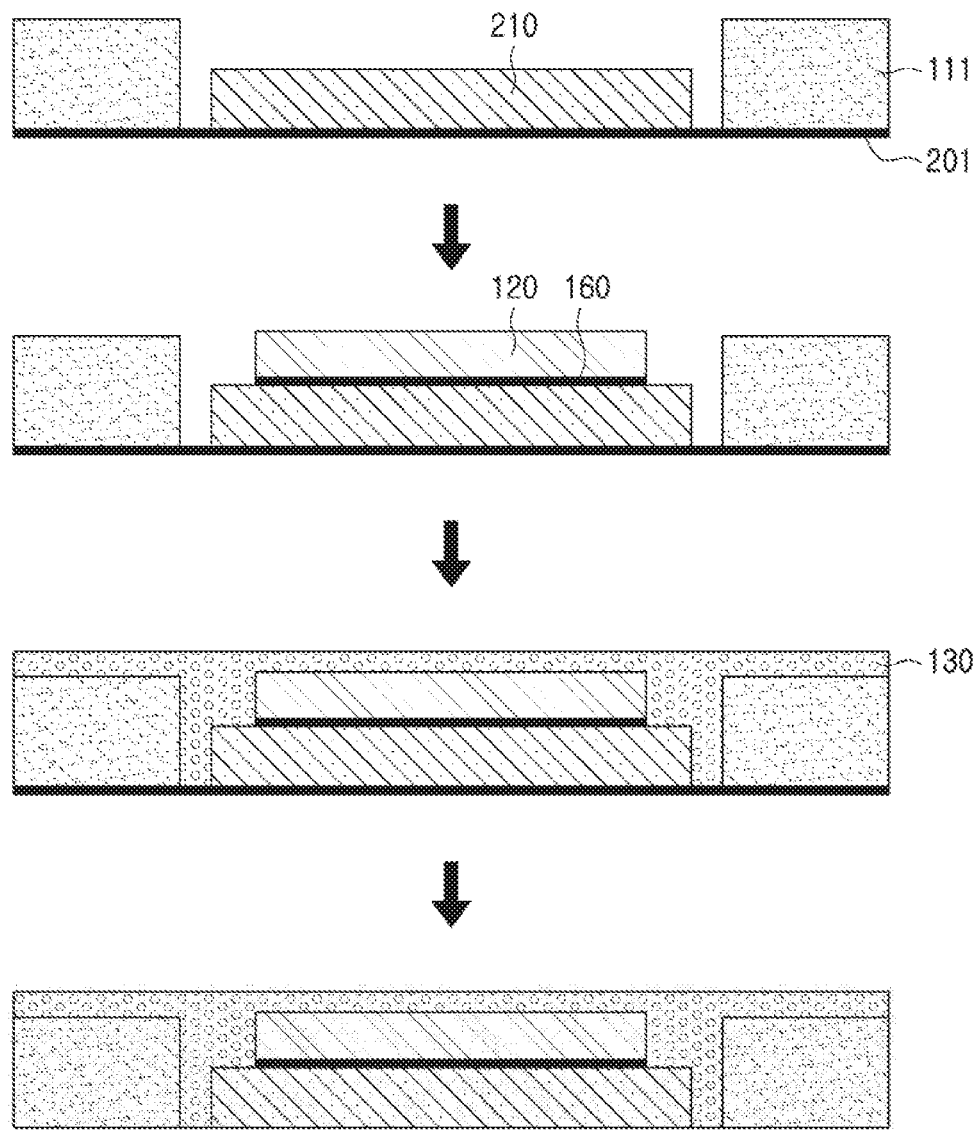

Next, as illustrated in FIG. 23, a sacrificial layer 210 may be disposed and a semiconductor chip 120 may be then disposed on the sacrificial layer 210. In this case, the sacrificial layer 210 and the semiconductor chip 120 may be bonded to each other by the adhesive layer 160. The sacrificial layer 210 may be a region to be removed in a subsequent process to form a cavity, and may be formed of, for example, a copper (Cu) block or the like. After the semiconductor chip 120 is disposed, an encapsulant 130 may be formed and the tape 201 may be then removed.

Figure 24:
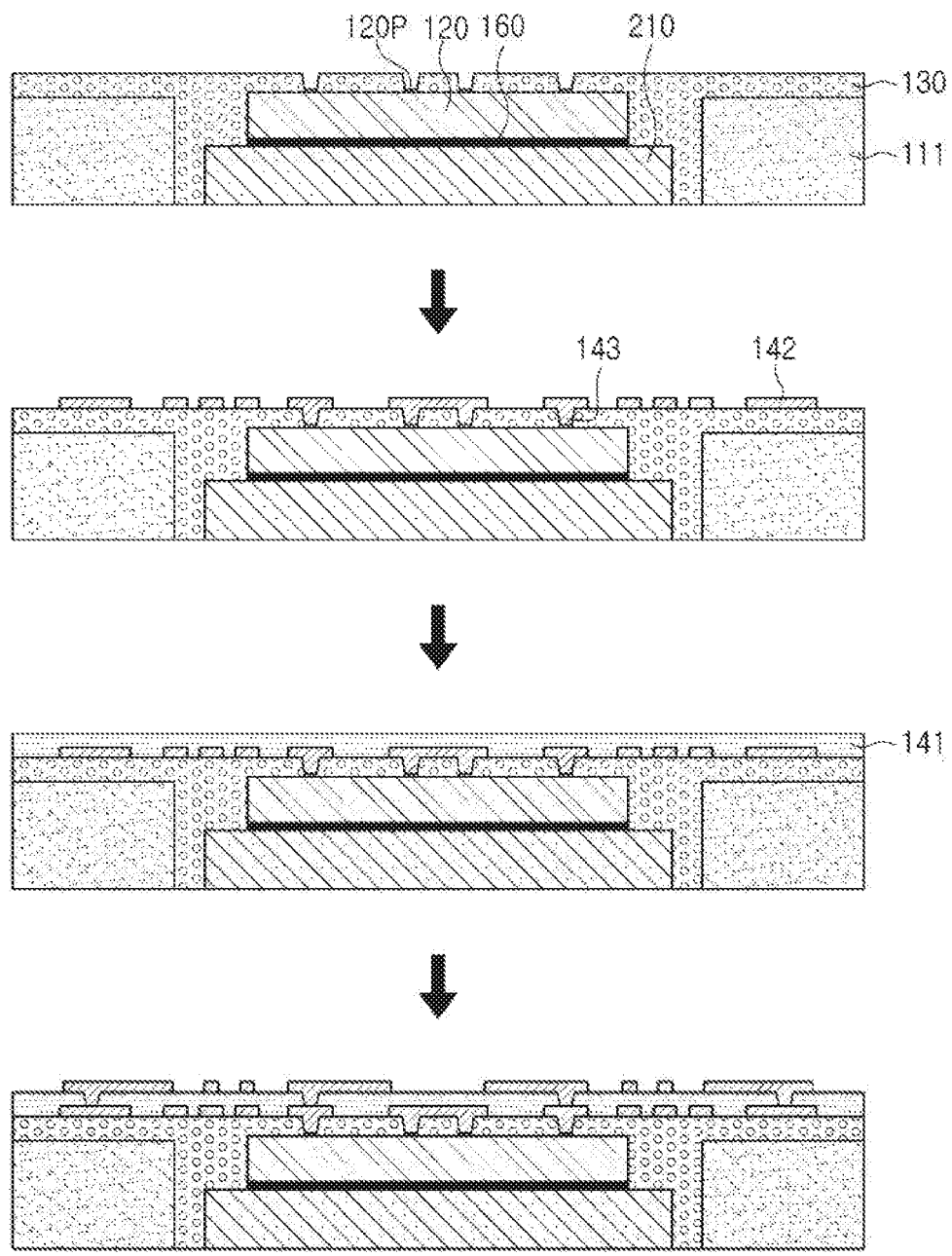

Next, as illustrated in FIG. 24, a second connection member capable of performing a redistribution function may be formed. To this end, holes may be formed in the encapsulant 130 and conductive vias 143 may be formed to fill the holes. In addition, the second connection member may be obtained by forming the redistribution layer 142 and the insulating layer 141 and then repeating the process of forming the holes of the insulating layer 141 and the process of filling the conductive vias 143 as required.

Figure 25:
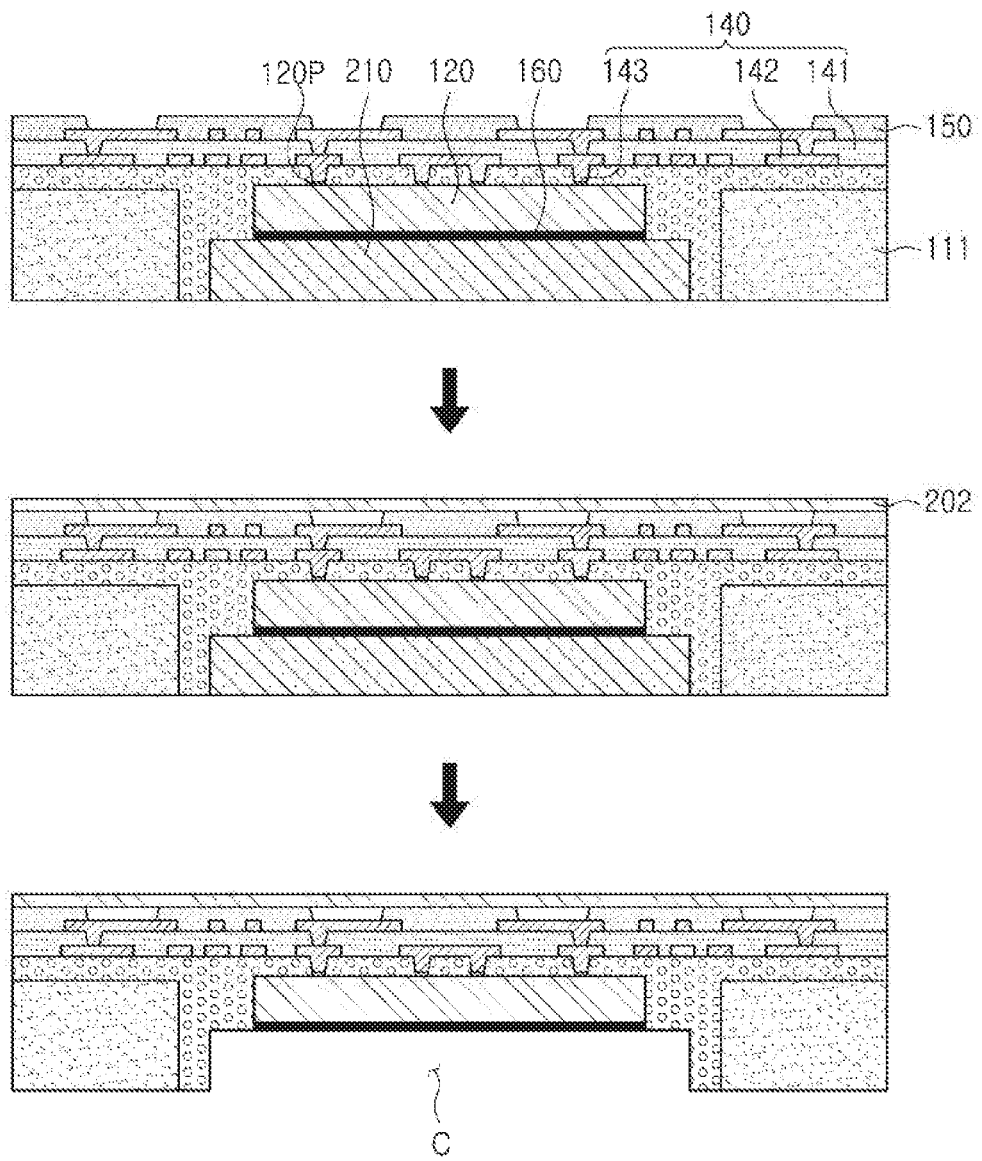

Next, as illustrated in FIG. 25, a passivation layer 150 may be formed and the sacrificial layer may be then removed to forma cavity C in the encapsulant 130. When the sacrificial layer 210 is removed, an etchant capable of selectively etching copper or the like may be applied, and in order to protect other components during this process, a protective layer 202 may be formed.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiments in the present disclosure, the fan-out semiconductor package may be thinned and high integrated.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first connection member having a through-hole;
a first semiconductor chip disposed in the through-hole and including an active surface having connection pads disposed thereon and an inactive surface opposing the active surface;
a second connection member disposed on the active surface of the first semiconductor chip and including a redistribution layer electrically connected to the first semiconductor chip; and
an encapsulant filling spaces between wall surfaces of the through-hole and side surfaces of the first semiconductor chip and having a cavity disposed above the inactive surface of the first semiconductor chip,
wherein the cavity is a recess in the encapsulant defined by an inner lower surface of the encapsulant disposed between an uppermost surface of the encapsulant and a lowermost surface of the encapsulant, and an inner side surface of the encapsulant connecting the uppermost surface of the encapsulant and the inner lower surface of the encapsulant,
the uppermost surface of the encapsulant is substantially coplanar with an upper surface of the first connection member,
the lowermost surface of the encapsulant is at a lower level than a lower surface of the first connection member.

2. The fan-out semiconductor package of claim 1, further comprising an adhesive layer disposed on the inactive surface of the first semiconductor chip,
wherein the inner lower surface is substantially coplanar with an upper surface of the adhesive layer.

3. The fan-out semiconductor package of claim 1, wherein the cavity has a first width greater than a second width of the first semiconductor chip.

4. The fan-out semiconductor package of claim 1, further comprising a heat radiation portion disposed in the cavity and bonded to the first semiconductor chip.

5. The fan-out semiconductor package of claim 1, wherein the encapsulant does not cover the inactive surface of the first semiconductor chip.

6. The fan-out semiconductor package of claim 1, wherein the cavity exposes entirely the inactive surface of the first semiconductor chip.

* * * * *